(12) United States Patent
Iyomasa et al.

(10) Patent No.: US 12,620,940 B2
(45) Date of Patent: May 5, 2026

(54) DOHERTY AMPLIFIER

(71) Applicant: Mitsubishi Electric Corporation, Tokyo (JP)

(72) Inventors: Kazuhiro Iyomasa, Tokyo (JP); Eigo Kuwata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 439 days.

(21) Appl. No.: 18/381,302

(22) Filed: Oct. 18, 2023

(65) Prior Publication Data

US 2024/0048102 A1     Feb. 8, 2024

Related U.S. Application Data

(63) Continuation of application No. PCT/JP2021/020147, filed on May 27, 2021.

(51) Int. Cl.
H03F 1/02 (2006.01)
H03F 1/56 (2006.01)
H03F 3/21 (2006.01)

(52) U.S. Cl.
CPC ........... H03F 1/0288 (2013.01); H03F 1/565 (2013.01); H03F 3/211 (2013.01); *H03F 2200/246* (2013.01); *H03F 2200/387* (2013.01)

(58) Field of Classification Search
CPC ..................................... H03F 1/02; H03F 1/07
USPC .............................................. 330/295, 124 R
See application file for complete search history.

(56) References Cited

U.S. PATENT DOCUMENTS

| | | | |
|---|---|---|---|
| 2005/0231278 A1 | 10/2005 | Blednov | |
| 2005/0231286 A1 | 10/2005 | Gotou et al. | |

FOREIGN PATENT DOCUMENTS

| | | |
|---|---|---|
| JP | 2005-303771 A | 10/2005 |
| JP | 2005-536922 A | 12/2005 |
| JP | 2018-74320 A | 5/2018 |
| WO | WO2020/235093 A1 | 11/2020 |

OTHER PUBLICATIONS

Indian First Examination Report for Indian Application No. 202347070413, dated Mar. 26, 2025, with English translation.
International Search Report (PCT/ISA/210) issued in PCT/JP2021/020147, dated Aug. 17, 2021.

*Primary Examiner* — Henry Choe
(74) *Attorney, Agent, or Firm* — Birch, Stewart, Kolasch & Birch, LLP

(57)     ABSTRACT

A Doherty amplifier includes: a carrier amplifier to amplify a first high frequency signal having a first higher harmonic and a second higher harmonic; a peak amplifier to amplify a second high frequency signal having the first higher harmonic and the second higher harmonic; a first series resonant circuit connected between an output end of the carrier amplifier and a ground, and configured to resonate at the frequency of the first higher harmonic; a second series resonant circuit connected between an output end of the peak amplifier and the ground, and configured to resonate at the frequency of the first higher harmonic; a first parallel resonant circuit configured to resonate at the frequency of the second higher harmonic; and a second parallel resonant circuit configured to resonate at the frequency of the second higher harmonic.

6 Claims, 9 Drawing Sheets

FIG. 1

Parasitic Capacitance 5.1pF
$N_1=2$, $N_2=3$, $Z_C$, $\theta=90°$
m_fc: Fundamental Wave
m_2fc: Second Harmonic
m_3fc: Third Harmonic Parasitic Capacitance 5.1pF
$N_1=2$, $N_2=3$, $Z_c$, $\theta=90°$ m_fc: Fundamental Wave

DOHERTY AMPLIFIER

CROSS REFERENCE TO RELATED APPLICATIONS

This application is a Continuation of PCT International Application No. PCT/JP2021/020147, filed on May 27, 2021, which is hereby expressly incorporated by reference into the present application.

TECHNICAL FIELD

The present disclosure relates to a Doherty amplifier.

BACKGROUND ART

A Doherty amplifier including a carrier amplifier, a peak amplifier, and a load modulation circuit is disclosed in Patent Literature 1. This load modulation circuit includes a first parallel resonant circuit, a second parallel resonant circuit, and a third parallel resonant circuit. The first parallel resonant circuit has an end connected to an output end of the carrier amplifier, and another end connected to a ground. The second parallel resonant circuit has an end connected to an output end of the peak amplifier, and another end connected to the ground. The third parallel resonant circuit has an end connected to the output end of the carrier amplifier, and another end connected to the output end of the peak amplifier.

Each of the first, second and third parallel resonant circuits undergoes parallel resonance at the frequency of a second harmonic which is one of multiple higher harmonics contained in a high frequency signal to be amplified. Each of the first, second and third parallel resonant circuits undergoes parallel resonance, and, as a result, the imped-ance, for the second harmonic, seen from each of the output ends of the carrier and peak amplifiers toward a load is infinite.

CITATION LIST

Patent Literature

Patent Literature 1: WO No. 2020/235093

SUMMARY OF INVENTION

Technical Problem

In the Doherty amplifier disclosed in Patent Literature 1, the impedance, for the second harmonic, seen from each of the output ends of the carrier and peak amplifiers toward the load side is maintained in a state in which the impedance is fixed to infinity even when the impedance of the load changes. On the other hand, there is a case in which a change in the impedance of the load causes a change in the imped-ance, for a third harmonic, seen from each of the output ends of the carrier and peak amplifiers toward the load. More specifically, a problem with the Doherty amplifier disclosed in Patent Literature 1 is that the Doherty amplifier cannot prevent a change in the impedance for any higher harmonic other than the single type of higher harmonic. In the case where the Doherty amplifier cannot prevent a change in the impedance for any higher harmonic other than the single type of higher harmonic, a change in the impedance for any other higher harmonic may cause degradation in the opera-tion efficiency of the Doherty amplifier.

The present disclosure is made in order to solve the above-mentioned problem, and it is therefore an object of the present disclosure to provide a Doherty amplifier that can prevent a change in the impedance for each of first and second higher harmonics, the change being caused by a change in the impedance of a load.

Solution to Problem

A Doherty amplifier according to the present disclosure includes: a carrier amplifier to amplify a first high frequency signal having a first higher harmonic and a second higher harmonic; a peak amplifier to amplify a second high fre-quency signal having the first higher harmonic and the second higher harmonic; a first series resonant circuit con-nected between an output end of the carrier amplifier and a ground, and configured to resonate at the frequency of the first higher harmonic; a second series resonant circuit con-nected between an output end of the peak amplifier and the ground, and configured to resonate at the frequency of the first higher harmonic; a first parallel resonant circuit having an end connected to the output end of the carrier amplifier, and another end connected to the output end of the peak amplifier, the first parallel resonant circuit being configured to resonate at the frequency of the second higher harmonic; and a second parallel resonant circuit having an end con-nected to the output end of the peak amplifier and the other end of the first parallel resonant circuit, and another end electrically connected to a load, the second parallel resonant circuit being configured to resonate at the frequency of the second higher harmonic.

Advantageous Effects of Invention

According to the present disclosure, the Doherty amplifier can prevent a change in the impedance for each of the first and second higher harmonics, the change being caused by a change in the impedance of the load.

BRIEF DESCRIPTION OF DRAWINGS

FIG. 1 is a schematic diagram showing a Doherty ampli-fier 100 according to Embodiment 1;

DESCRIPTION OF EMBODIMENTS

Figure 2:
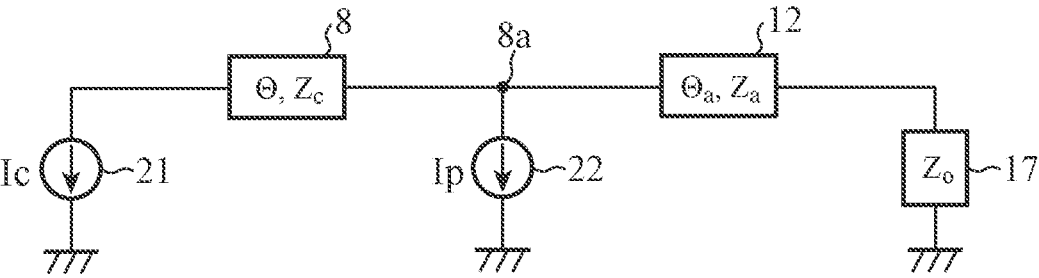
FIG. 2 is an equivalent circuit diagram showing the Doherty amplifier 100 shown in FIG. 1.

Hereinafter, in order to explain the present disclosure in greater detail, embodiments of the present disclosure will be explained with reference to the accompanying drawings.

Embodiment 1

Figure 1:
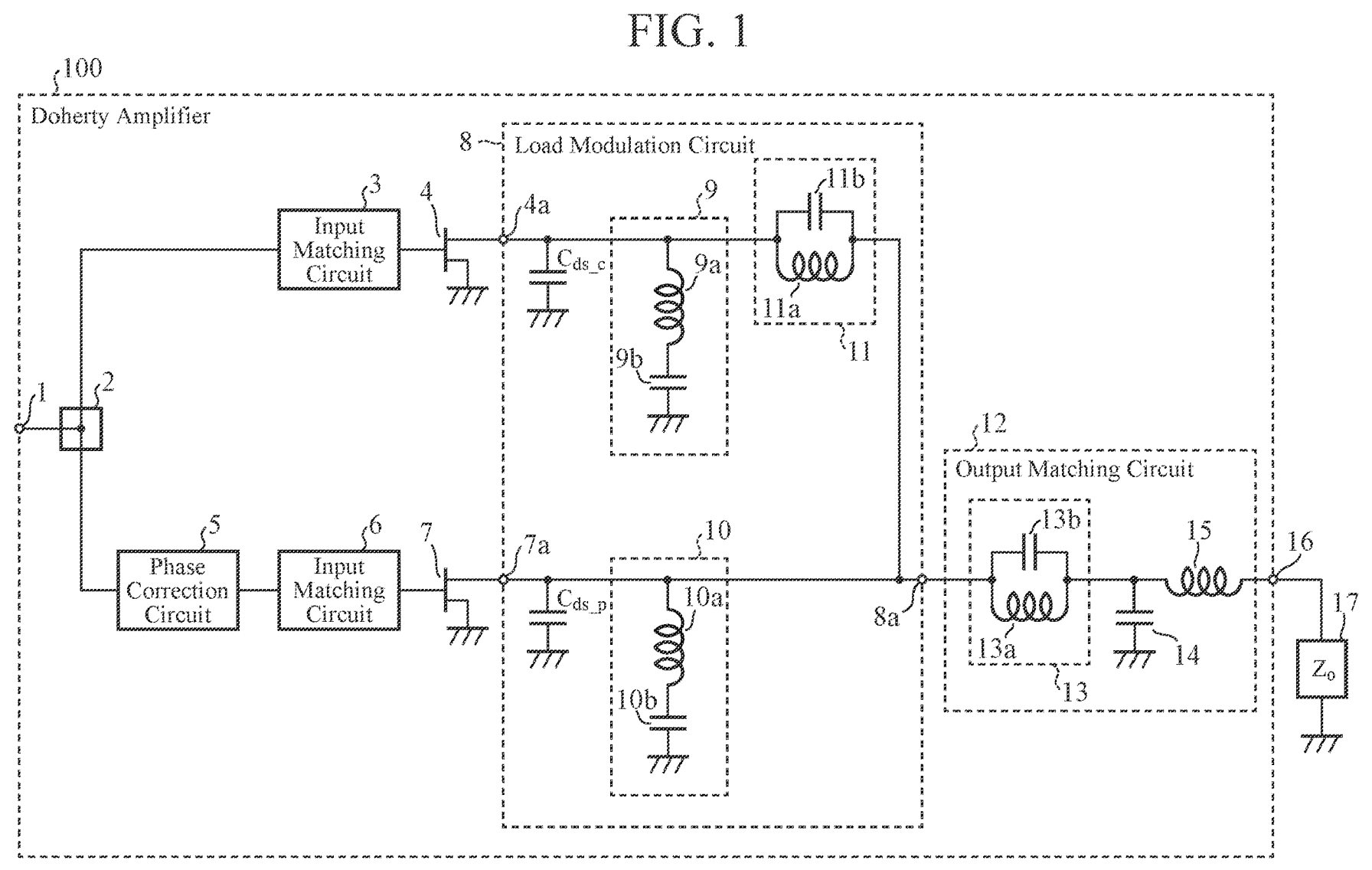

FIG. 1 is a schematic diagram showing a Doherty amplifier 100 according to Embodiment 1.

The Doherty amplifier 100 shown in FIG. 1 includes an input terminal 1, a signal splitter 2, an input matching circuit 3, a carrier amplifier 4, a phase correction circuit 5, an input matching circuit 6, a peak amplifier 7, a load modulation circuit 8, an output matching circuit 12, and an output terminal 16.

The input terminal 1 is a terminal to which a high frequency signal to be amplified is applied from outside the Doherty amplifier 100. The high frequency signal to be amplified has a fundamental wave, a first higher harmonic, and a second higher harmonic.

The signal splitter 2 splits the power of the high frequency signal applied to the input terminal 1 into two parts. The splitting of the power into two parts may be equally splitting of the power or unequally splitting of the power.

The signal splitter 2 outputs one of high frequency signals after splitting, as a first high frequency signal, to the input matching circuit 3, and outputs the other one of the high frequency signals after splitting, as a second high frequency signal, to the phase correction circuit 5.

The input matching circuit 3 has an end connected to an output end of the signal splitter 2, and another end connected to an input end of the carrier amplifier 4.

The input matching circuit 3 is configured to match the impedance of the input end of the carrier amplifier 4 with the impedance of the input terminal 1.

The carrier amplifier 4 is implemented by a metal oxide semiconductor (MOS) transistor, a bipolar junction transistor, a field effect transistor (FET), or the like.

In the case where the carrier amplifier 4 is implemented by, for example, a grounded-source FET, the input end of the carrier amplifier 4 is the gate terminal of the FET, and an output end 4a of the carrier amplifier 4 is the drain terminal of the FET.

The input end of the carrier amplifier 4 is connected to the other end of the input matching circuit 3, and the output end 4a of the carrier amplifier 4 is connected to an input end of the load modulation circuit 8.

The carrier amplifier 4 amplifies the first high frequency signal passed through the input matching circuit 3, and outputs the first high frequency signal after amplification to the load modulation circuit 8.

The phase correction circuit 5 is implemented by, for example, a 90-degree line.

The phase correction circuit 5 has an end connected to another output end of the signal splitter 2, and another end connected to an end of the input matching circuit 6.

The phase correction circuit 5 delays the phase of the second high frequency signal outputted from the signal splitter 2 by 90 degrees, and outputs the second high frequency signal after phase delay to the input matching circuit 6.

The end of the input matching circuit 6 is connected to the other end of the phase correction circuit 5, and another end of the input matching circuit 6 is connected to an input end of the peak amplifier 7.

The input matching circuit 6 is configured to match the impedance of the input end of the peak amplifier 7 with the impedance of the input terminal 1.

The peak amplifier 7 is implemented by a MOS transistor, a bipolar junction transistor, an FET, or the like.

In the case where the peak amplifier 7 is implemented by, for example, a grounded-source FET, the input end of the peak amplifier 7 is the gate terminal of the FET, and an output end 7a of the peak amplifier 7 is the drain terminal of the FET.

The input end of the peak amplifier 7 is connected to the other end of the input matching circuit 6, and the output end 7a of the peak amplifier 7 is connected to another input end of the load modulation circuit 8.

The peak amplifier 7 amplifies the second high frequency signal passed through the input matching circuit 6, and outputs the second high frequency signal after amplification to the load modulation circuit 8.

The load modulation circuit 8 includes a first series resonant circuit 9, a second series resonant circuit 10, and a first parallel resonant circuit 11.

The load modulation circuit 8 also includes the parasitic capacitance Cds_c of the carrier amplifier 4 and the parasitic capacitance Cds_p of the peak amplifier 7.

The input end of the load modulation circuit 8 is connected to the output end 4a of the carrier amplifier 4, and the other input end of the load modulation circuit 8 is connected to the output end 7a of the peak amplifier 7.

The load modulation circuit 8 has an output end 8a which is connected to the output end 7a of the peak amplifier 7, the end of the second series resonant circuit 10, the other end of the first parallel resonant circuit 11, and an end of a second parallel resonant circuit 13 which will be mentioned later.

The first series resonant circuit 9 is a series circuit in which an inductor 9a and a capacitor 9b are connected in series.

The first series resonant circuit 9 is connected between the output end 4a of the carrier amplifier 4 and a ground.

The first series resonant circuit 9 resonates at the frequency of the first higher harmonic. In the Doherty amplifier 100 shown in FIG. 1, the first higher harmonic is a second harmonic of the fundamental wave contained in the high frequency signal applied to the input terminal 1.

The inductor 9a has an end connected to the output end 4a of the carrier amplifier 4, and another end connected to an end of the capacitor 9b. The inductance of the inductor 9a is Los.

The end of the capacitor 9b is connected to the other end of the inductor 9a, and another end of the capacitor 9b is connected to the ground. The capacitance of the capacitor 9b is Coo.

The second series resonant circuit 10 is a series circuit in which an inductor 10a and a capacitor 10b are connected in series.

The second series resonant circuit 10 is connected between the output end 7a of the peak amplifier 7 and the ground.

The second series resonant circuit 10 resonates at the frequency of the first higher harmonic.

The inductor 10a has an end connected to the output end 7a of the peak amplifier 7, and another end connected to an end of the capacitor 10b. The inductance of the inductor 10a is $L_{Op}$.

The end of the capacitor 10b is connected to another end of the inductor 10a, and another end of the capacitor 10b is connected to the ground. The capacitance of the capacitor 10b is $C_{0p}$.

The first parallel resonant circuit 11 is a parallel circuit in which an inductor 11a and a capacitor 11b are connected in parallel.

The first parallel resonant circuit 11 has an end connected to the output end 4a of the carrier amplifier 4 and an end of the first series resonant circuit 9, and another end connected to the output end 8a.

The first parallel resonant circuit 11 resonates at the frequency of the second higher harmonic. In the Doherty amplifier 100 shown in FIG. 1, the second higher harmonic is a third harmonic of the fundamental wave contained in the high frequency signal applied to the input terminal 1.

The inductor 11a has an end connected to the output end 4a of the carrier amplifier 4 and the end of the inductor 9a, and another end connected to the output end 8a. The inductance of the inductor 11a is $L_1$.

The capacitor 11b is connected in parallel to the inductor 11a. The capacitance of the capacitor 11b is $C_1$.

The output matching circuit 12 includes the second parallel resonant circuit 13, a capacitor 14, and an inductor 15.

The output matching circuit 12 has an end connected to the output end 8a of the load modulation circuit 8. The output matching circuit 12 has another end connected to an end of a load 17 via the output terminal 16.

The output matching circuit 12 is configured to match the impedance of the output end 8a of the load modulation circuit 8 with the impedance of the load 17 at the frequency of the fundamental wave.

The second parallel resonant circuit 13 is a parallel circuit in which an inductor 13a and a capacitor 13b are connected in parallel.

The second parallel resonant circuit 13 has an end connected to the output end 8a of the load modulation circuit 8. The second parallel resonant circuit 13 has another end electrically connected to the load 17. More specifically, the other end of the second parallel resonant circuit 13 is connected to an end of the capacitor 14 and an end of the inductor 15.

The second parallel resonant circuit 13 resonates at the frequency of the second higher harmonic.

The inductor 13a has an end connected to the output end 8a of the load modulation circuit 8. The inductor 13a has another end connected to the end of the capacitor 14 and the end of the inductor 15. The inductance of the inductor 13a is $L_2$.

The capacitor 13b is connected in parallel to the inductor 13a. The capacitance of the capacitor 13b is $C_2$.

The end of the capacitor 14 is connected to the other end of the second parallel resonant circuit 13, and another end of the capacitor 14 is connected to the ground. The capacitance of the capacitor 14 is $C_3$.

The end of the inductor 15 is connected to the other end of the second parallel resonant circuit 13, and another end of the inductor 15 is connected to the output terminal 16. The inductance of the inductor 15 is $L_3$.

The output terminal 16 is configured to output the high frequency signal after amplification by the Doherty amplifier 100 to the load 17.

The end of the load 17 is connected to the output terminal 16, and another end of the load 17 is connected to the ground.

The impedance of the load 17 is $Z_0$.

Next, the operation of the Doherty amplifier 100 shown in FIG. 1 will be explained.

The signal splitter 2 splits the power of the high frequency signal which is applied to the input terminal 1 from outside the Doherty amplifier 100 into two parts.

The signal splitter 2 outputs one high frequency signal after splitting, as the first high frequency signal, to the input matching circuit 3.

The signal splitter 2 also outputs the other high frequency signal after splitting, as the second high frequency signal, to the phase correction circuit 5.

The first high frequency signal outputted from the signal splitter 2 to the input matching circuit 3 is outputted, via the input matching circuit 3, to the input end of the carrier amplifier 4.

The second high frequency signal outputted from the signal splitter 2 to the input matching circuit 3 passes through the phase correction circuit 5, and, as a result, the phase of the second high frequency signal is delayed by 90 degrees.

The second high frequency signal after phase delay by the phase correction circuit 5 is outputted, via the input matching circuit 6, to the input end of the peak amplifier 7.

The carrier amplifier 4 amplifies the first high frequency signal passed through the input matching circuit 3.

The carrier amplifier 4 outputs the first high frequency signal after amplification to the load modulation circuit 8.

When the power of the second high frequency signal passed through the input matching circuit 6 is less than a threshold, the peak amplifier 7 stops the amplification operation. When the peak amplifier 7 is not performing the amplification operation, the second high frequency signal passed through the input matching circuit 6 disappears in the peak amplifier 7.

When the power of the second high frequency signal passed through the input matching circuit 6 is greater than or equal to the threshold, the peak amplifier 7 amplifies the second high frequency signal.

The peak amplifier 7 outputs the second high frequency signal after amplification to the load modulation circuit 8.

The load modulation circuit 8 delays the phase of the fundamental wave contained in the first high frequency signal outputted from the carrier amplifier 4 by 90 degrees.

Further, the load modulation circuit 8 resonates at each of the frequencies of the first and second higher harmonics.

More specifically, the first series resonant circuit 9 included in the load modulation circuit 8 resonates at the frequency of the second harmonic which is the first higher harmonic.

The second series resonant circuit 10 included in the load modulation circuit 8 resonates at the frequency of the second harmonic which is the first higher harmonic.

The first parallel resonant circuit 11 included in the load modulation circuit 8 resonates at the frequency of the third harmonic which is the second higher harmonic. The first high frequency signal passed through the first series resonant circuit 9 and the first parallel resonant circuit 11 and the second high frequency signal passed through the second series resonant circuit 10 are combined, and a high frequency signal after combination is outputted from the output end 8a to the output matching circuit 12.

The second parallel resonant circuit 13 included in the output matching circuit 12 resonates at the frequency of the third harmonic which is the second higher harmonic.

Each of the first and second series resonant circuits 9 and 10 resonates at the frequency of the second harmonic, and, as a result, a short-circuited end is formed, for the second harmonic, on the output side of each of the carrier and peak amplifiers 4 and 7. More specifically, the impedance, for the second harmonic, seen from each of the output ends 4a and 7a of the carrier and peak amplifiers 4 and 7 toward the load 17 is substantially zero.

Each of the first and second parallel resonant circuits 11 and 13 resonates at the frequency of the third harmonic, and, as a result, an open end is formed, for the third harmonic, on the output side of each of the carrier and peak amplifiers 4 and 7. More specifically, the impedance, for the third harmonic, seen from each of the output ends 4a and 7a of the carrier and peak amplifiers 4 and 7 toward the load 17 is infinite.

Because a short-circuited end is formed for the second harmonic, and, as a result, the impedance for the second harmonic at each of the following current sources: the current source 21 of the carrier amplifier 4 (see FIG. 2) and the current source 22 of the peak amplifier 7 (see FIG. 2) is substantially zero, each of the carrier and peak amplifiers 4 and 7 performs a class F mode operation. Therefore, each of the carrier and peak amplifiers 4 and 7 operates with a high degree of efficiency.

Because the impedance, for the second harmonic, seen toward the load 17 is fixed to substantially zero, the impedance, for the second harmonic, seen toward the load 17 does not change even when the impedance for the second harmonic, out of the impedance $Z_0$ of the load 17, changes. Further, because the impedance, for the third harmonic, seen toward the load 17 is fixed to infinity, the impedance, for the third harmonic, seen toward the load 17 does not change even when the impedance for the third harmonic, out of the impedance $Z_0$ of the load 17, changes.

Therefore, even when the impedance for the second harmonic at the load 17 or the impedance for the third harmonic at the load 17 changes, the degradation in the operation efficiency of the Doherty amplifier 100 is prevented.

Next, the operation of the load modulation circuit 8 will be explained concretely.

FIG. 2 is an equivalent circuit diagram showing the Doherty amplifier 100 shown in FIG. 1.

In FIG. 2, the current source 21 is the current source of the transistor which implements the carrier amplifier 4.

The current source 22 is the current source of the transistor which implements the peak amplifier 7.

The load modulation circuit 8 corresponds to a load modulation line which connects the current source 21 and the current source 22, and the characteristic impedance of the load modulation circuit 8 is $Z_c$. The electric length of the load modulation circuit 8 is θ.

When the Doherty amplifier 100 is, for example, an ideal one which performs a backoff operation of 6 dB, $Z_c$=50Ω and θ=90 degrees at the frequency of the fundamental wave.

In this case, the impedance seen from the output end 8a of the load modulation circuit 8 toward the load 17 is 25Ω.

The characteristic impedance of the output matching circuit 12 is $Z_a$, and the electric length of the output matching circuit 12 is $θ_a$. The output matching circuit 12 matches the impedance of the output end 8a of the load modulation circuit 8 with the impedance of the load 17 at the frequency of the fundamental wave.

Figure 3:
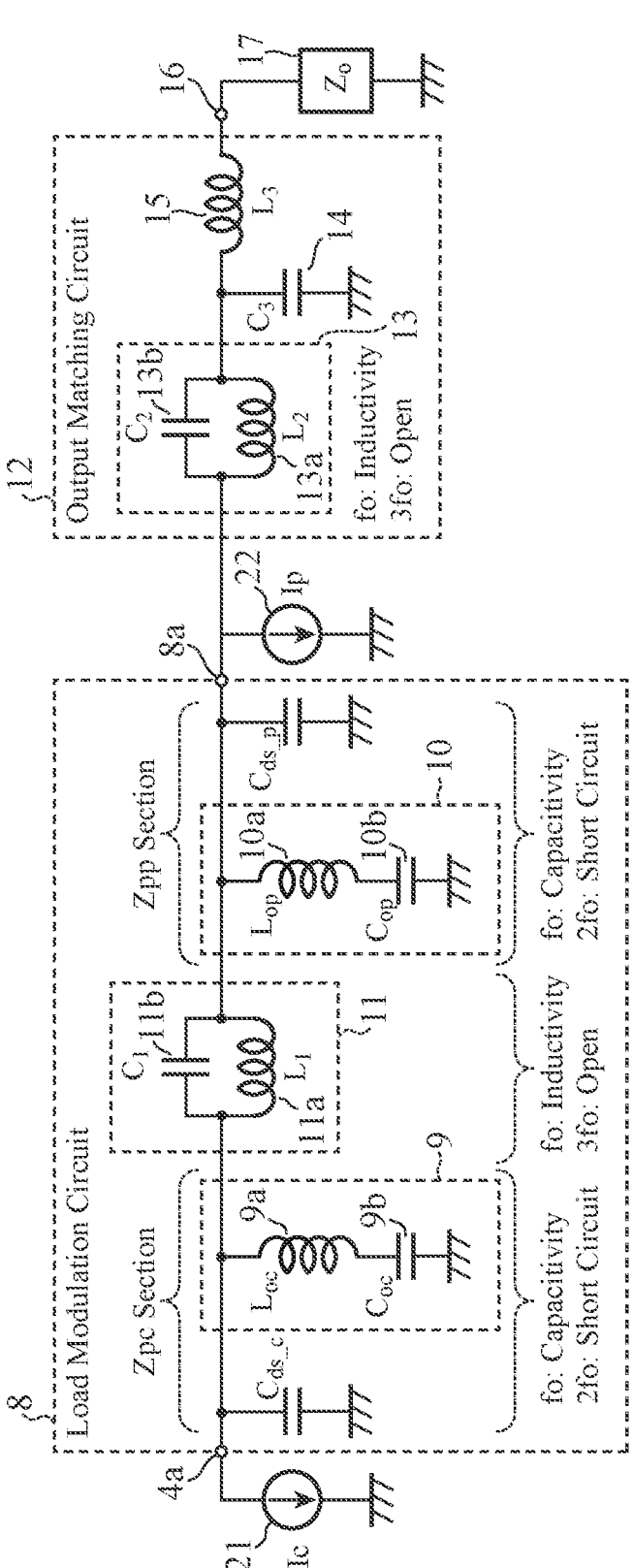
FIG. 3 is an explanatory drawing showing concrete con-figurations of a load modulation circuit 8 and an output matching circuit 12 which are shown in FIG. 2.

FIG. 3 is an explanatory drawing showing concrete configurations of the load modulation circuit 8 and the output matching circuit 12 which are shown in FIG. 2.

The load modulation circuit 8 includes the parasitic capacitance Cds_c of the carrier amplifier 4 and the parasitic capacitance Cds_p of the peak amplifier 7, as shown in FIG. 3.

In FIG. 3, a Zpc section is comprised of the first series resonant circuit 9 including the inductor 9a and the capacitor 9b, and the parasitic capacitance Cds_c of the carrier amplifier 4.

Further, a Zpp section is comprised of the second series resonant circuit 10 including the inductor 10a and the capacitor 10b, and the parasitic capacitance Cds_p of the peak amplifier 7.

Because the load modulation circuit 8 includes the parasitic capacitance Cds_c and the parasitic capacitance Cds_p, the load modulation circuit 8 does not have to separately include a capacitor having the same capacitance as these parasitic capacitances.

Here, when the angular frequency corresponding to the center frequency $f_0$ of the fundamental wave is denoted by w, the capacitance $C_{0c}$ of the capacitor 9b, the inductance $L_{0c}$ of the inductor 9a, the capacitance $C_{0p}$ of the capacitor 10b, and the inductance $L_{0p}$ of the inductor 10a are expressed by the following equations (1) to (4).

As can be seen from the equations (1) and (2), each of the following quantities: the capacitance $C_{0c}$ of the capacitor 9b and the inductance $L_{0c}$ of the inductor 9a is determined on the basis of the parasitic capacitance Cds_c of the carrier amplifier 4. As can be seen from the equations (3) and (4), each of the following quantities: the capacitance $C_{0p}$ of the capacitor 10b and the inductance $L_{0p}$ of the inductor 10a is determined on the basis of the parasitic capacitance Cds_p of the peak amplifier 7.

Further, the capacitance $C_1$ of the capacitor 11b and the inductance $L_1$ of the inductor 11a are expressed by the following equations (5) and (6).

$$C_{0c} = \frac{N_1^2 - 1}{N_1^2}\left(\frac{(1 - \cos\theta)}{\omega Z_c \sin\theta} - C_{ds\_c}\right) \tag{1}$$

$$L_{0c} = \frac{1}{N_1^2 \omega^2 C_{0c}} \tag{2}$$

$$C_{0p} = \frac{N_1^2 - 1}{N_1^2}\left(\frac{(1 - \cos\theta)}{\omega Z_c \sin\theta} - C_{ds\_p}\right) \tag{3}$$

$$L_{0p} = \frac{1}{N_1^2 \omega^2 C_{0p}} \tag{4}$$

$$C_1 = \frac{1}{N_2^2 \omega^2 L_1} \tag{5}$$

$$L_1 = \frac{Z_c \sin\theta}{\omega}\left(1 - \frac{1}{N_2^2}\right) \tag{6}$$

In the equations (1) to (6), $N_1$ denotes the order showing the first higher harmonic, and in the Doherty amplifier 100 shown in FIG. 1 $N_1$=2 because the first higher harmonic is the second harmonic.

$N_2$ denotes the order showing the second higher harmonic, and in the Doherty amplifier 100 shown in FIG. 1 $N_2$=3 because the second higher harmonic is the third harmonic.

In the Doherty amplifier 100 shown in FIG. 1, the load modulation circuit 8 implements a circuit whose characteristic impedance is $Z_c$ and whose electric length is θ at the center frequency $f_0$ of the fundamental wave.

Each of the Zpc and Zpp sections exhibits capacitivity (shown as "Capacitivity" in FIG. 3) at the center frequency $f_0$ of the fundamental wave, and undergoes series resonance at the frequency $N_1 \times f_0$ of the second harmonic, thereby forming a short-circuited end for the second harmonic.

The first parallel resonant circuit 11 exhibits inductivity (shown as "Inductivity" in FIG. 3) at the center frequency $f_0$ of the fundamental wave, and undergoes parallel resonance at the frequency $N_2 \times f_0$ of the third harmonic, thereby forming an open end for the third harmonic.

The output matching circuit 12 implements a circuit whose characteristic impedance is Z a and whose electric length is $\theta_a$, at the center frequency $f_0$ of the fundamental wave.

The second parallel resonant circuit 13 exhibits inductivity at the center frequency $f_0$ of the fundamental wave, and undergoes parallel resonance at the frequency $N_2 \times f_0$ of the third harmonic, thereby forming an open end for the third harmonic.

The output matching circuit 12 includes the second parallel resonant circuit 13 in which the inductor 13*a* and the capacitor 13*b* are connected in parallel, the capacitor 14 connected in parallel to the second parallel resonant circuit 13, and the inductor 15 connected in series to the second parallel resonant circuit 13. The second parallel resonant circuit 13, the capacitor 14, and the inductor 15 constitute an asymmetric T-type circuit.

When the angular frequency corresponding to the center frequency $f_0$ of the fundamental wave is denoted by co, the inductance $L_2$ of the inductor 13*a*, the capacitance $C_2$ of the capacitor 13*b*, the inductance $L_3$ of the inductor 15, and the capacitance $C_3$ of the capacitor 14 are expressed by the following equations (7) to (10).

$$L_2 = \frac{Z_a(1 - \cos \theta_a)}{\omega \sin \theta_a}\left(1 - \frac{1}{N_2^2}\right) \tag{7}$$

$$C_2 = \frac{1}{N_2^2 \omega^2 L_2} \tag{8}$$

$$L_3 = \frac{Z_a(1 - \cos \theta_a)}{\omega \sin \theta_a} \tag{9}$$

$$C_3 = \frac{\sin \theta_a}{\omega Z_a} \tag{10}$$

Figure 4:
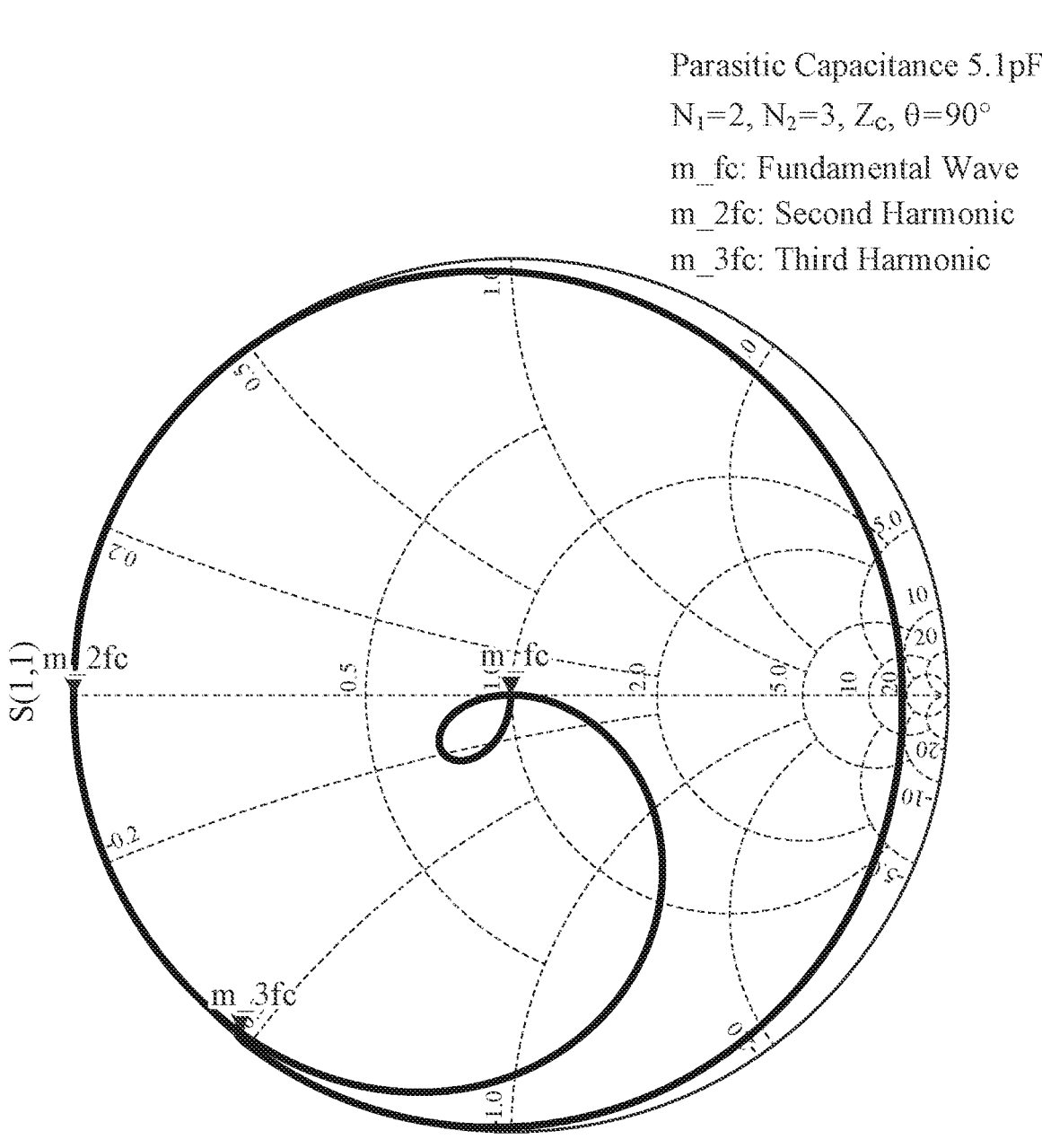
FIG. 4 is a Smith chart showing a result of the calculation of the impedance of the load modulation circuit 8 when it is assumed that each of the parasitic capacitances Cds_c and Cds_p of carrier and peak amplifiers 4 and 7 is 5.1 [pF]

FIG. 4 is a Smith chart showing a result of the calculation of the impedance of the load modulation circuit 8 when it is assumed that each of the parasitic capacitances Cds_c and Cds_p of the carrier and peak amplifiers 4 and 7 is 5.1 [pF].

The normalized impedance in the Smith chart shown in FIG. 4 is the characteristic impedance $Z_c$ of the load modulation circuit 8, and the electric length $\theta$ of the load modulation circuit 8 is 90 degrees.

In FIG. 4, m_fc denotes the fundamental wave, m_2fc denotes the second harmonic, and m_3fc denotes the third harmonic.

Figure 5:
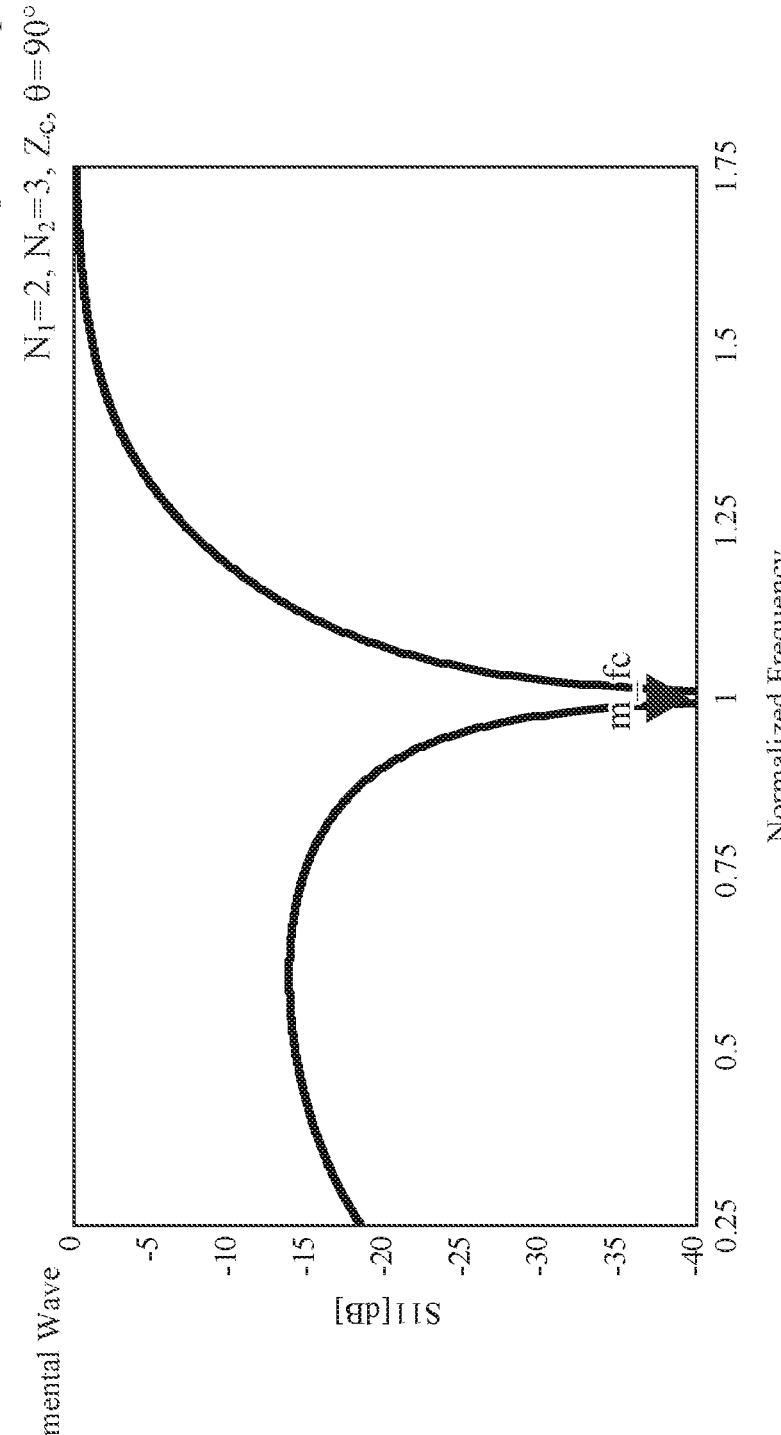
FIG. 5 is an explanatory drawing showing a graph in which the reflection coefficient of the load modulation circuit 8 is expressed in decibels.

FIG. 5 is an explanatory drawing showing a graph in which the reflection coefficient of the load modulation circuit 8 is expressed in decibels.

In FIG. 5, the horizontal axis shows the normalized frequency, and the vertical axis shows the decibel value of the reflection coefficient S11.

Figure 6:
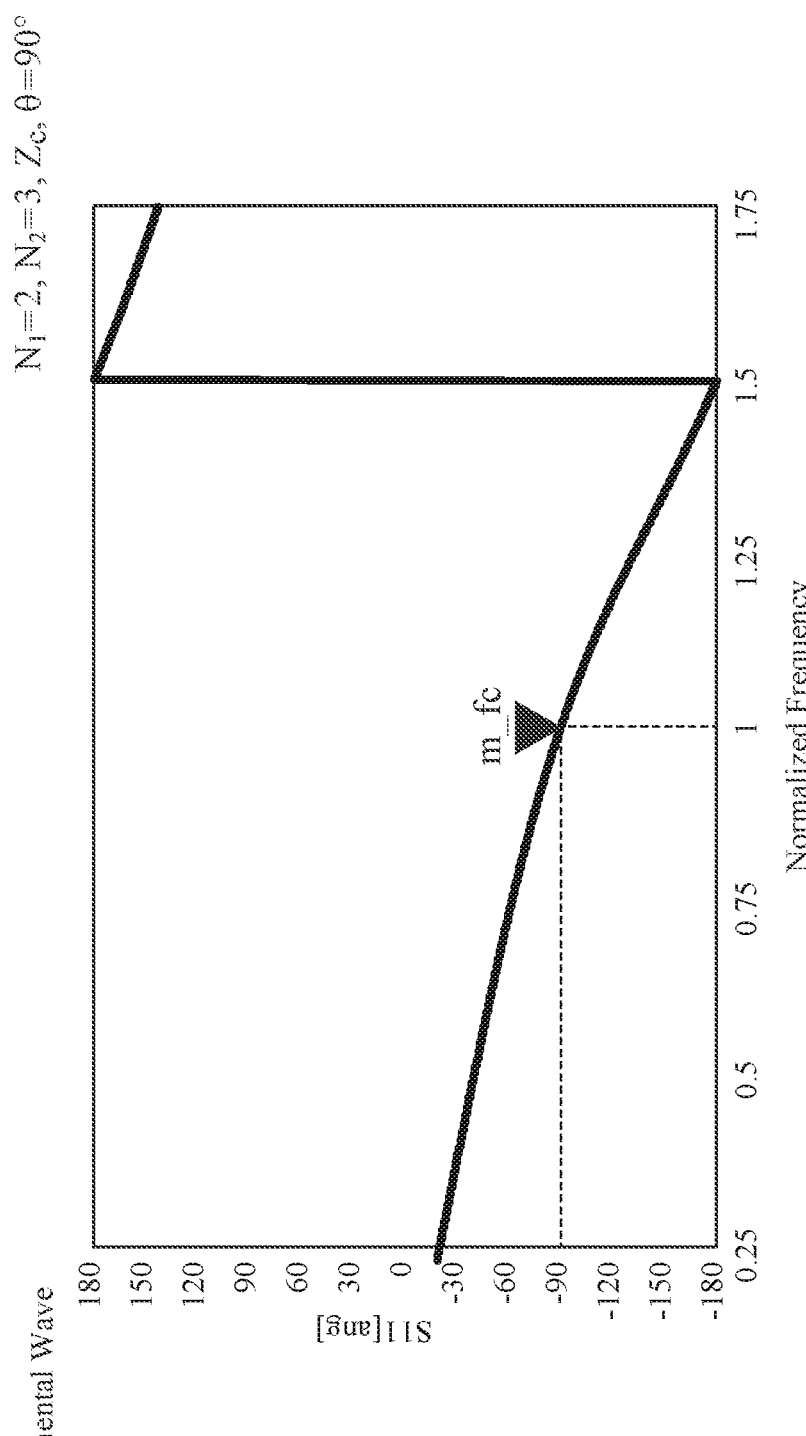
FIG. 6 is an explanatory drawing showing a result of the calculation of the transmission phase of the load modulation circuit 8.

FIG. 6 is an explanatory drawing showing a result of calculation of the transmission phase of the load modulation circuit 8.

In FIG. 6, the horizontal axis shows the normalized frequency, and the vertical axis shows the transmission phase.

It is seen from FIGS. 4 and 5 that the impedance of the load modulation circuit 8 matches with the characteristic impedance $Z_c$ at the center frequency $f_0$ of the fundamental wave.

Further, it is seen from FIG. 4 that a short-circuited end is formed at the frequency of the second harmonic. It is seen from FIG. 6 that the transmission phase of the load modulation circuit 8 can be set to 90 degrees at the center frequency $f_0$ of the fundamental wave.

Figure 7:
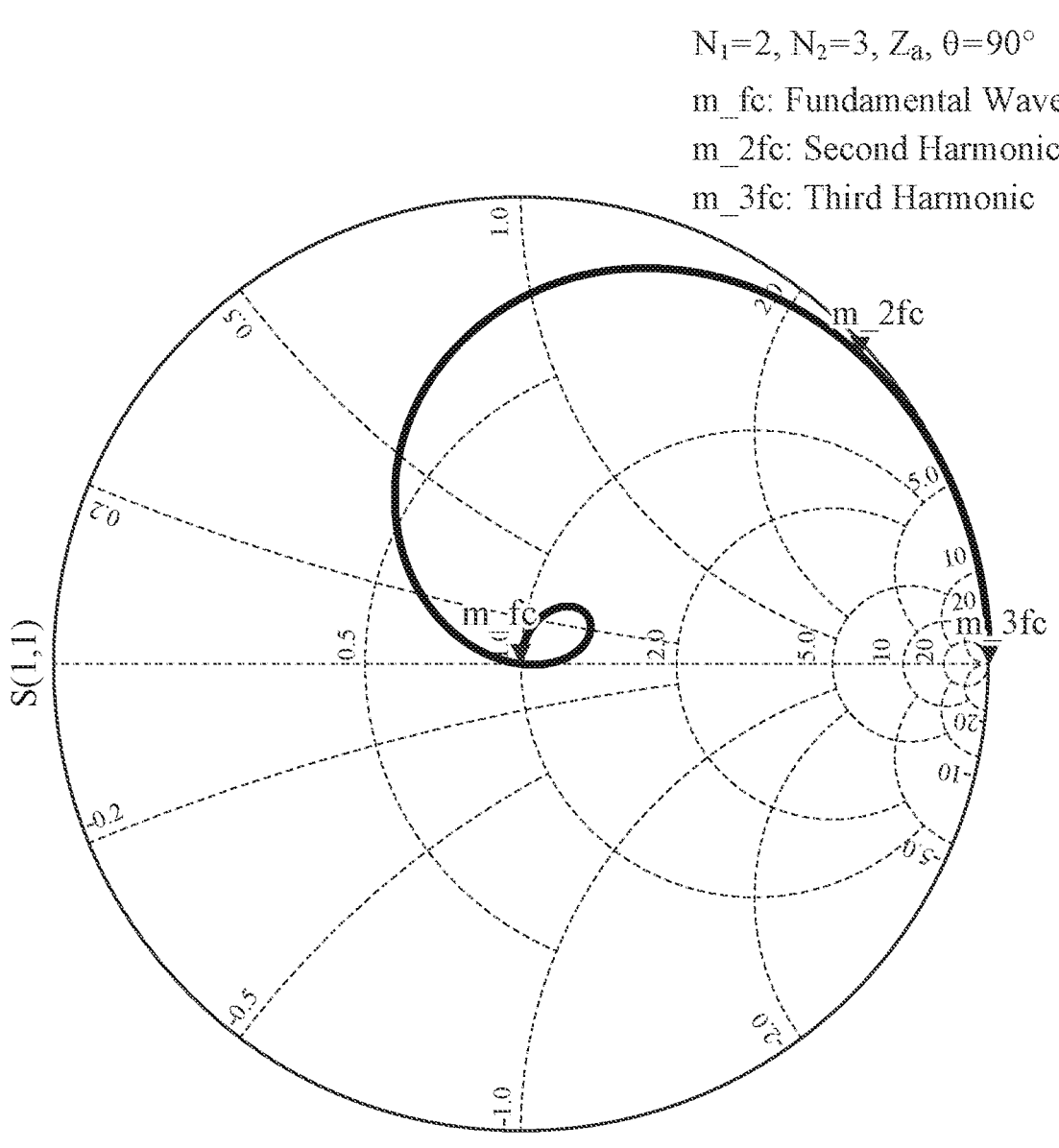
FIG. 7 is a Smith chart showing a result of the calculation of the impedance of the output matching circuit 12 when it is assumed that each of the parasitic capacitances Cds_c and Cds_p of the carrier and peak amplifiers 4 and 7 is 5.1 [pF]

FIG. 7 is a Smith chart showing a result of the calculation of the impedance of the output matching circuit 12 when it is assumed that each of the parasitic capacitances Cds_c and Cds_p of the carrier and peak amplifiers 4 and 7 is 5.1 [pF].

The normalized impedance in the Smith chart shown in FIG. 7 is the characteristic impedance Z a of the output matching circuit 12, and the electric length $\theta$ of the output matching circuit 12 is 90 degrees.

In FIG. 7, m_fc denotes the fundamental wave, m_2fc denotes the second harmonic, and m_3fc denotes the third harmonic.

Figure 8:
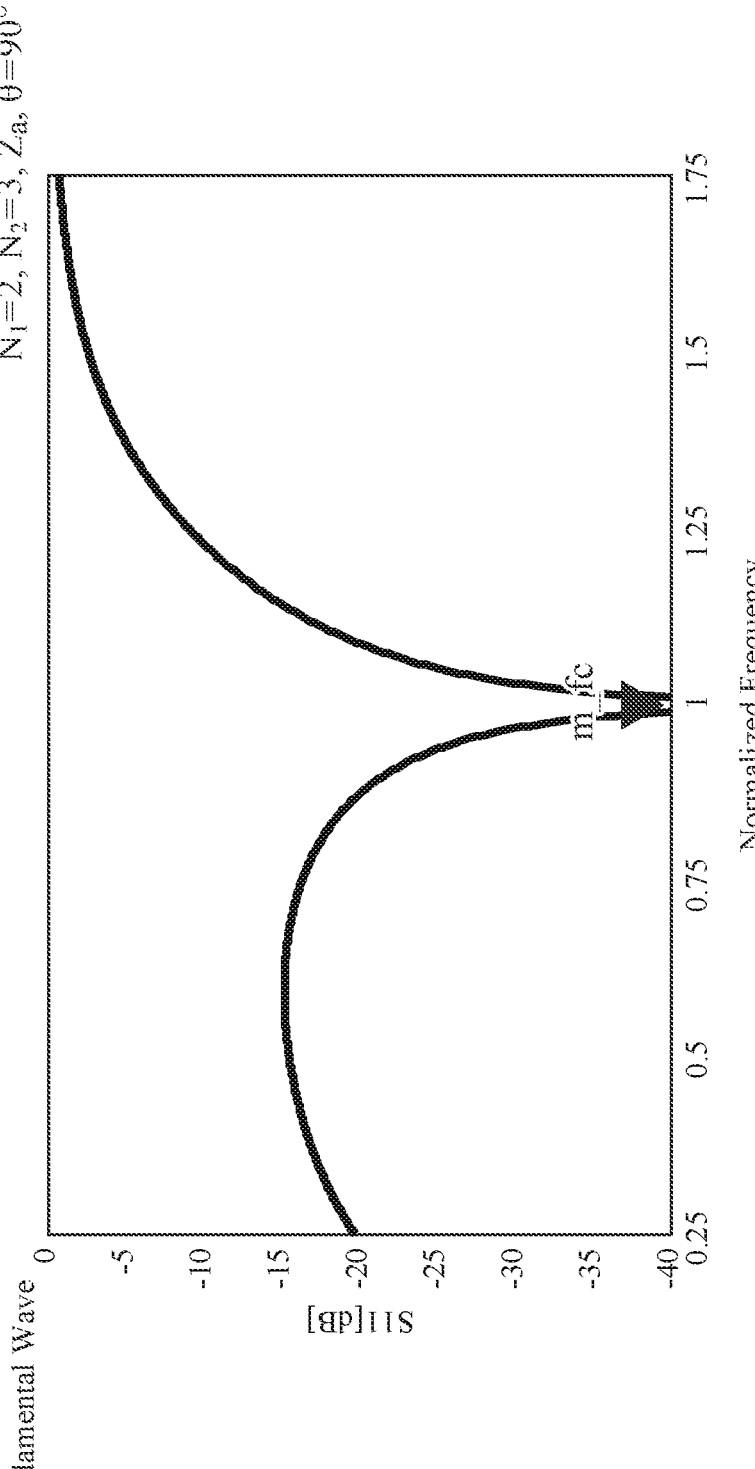
FIG. 8 is an explanatory drawing showing a graph in which the reflection coefficient of the output matching circuit 12 is expressed in decibels.

FIG. 8 is an explanatory drawing showing a graph in which the reflection coefficient of the output matching circuit 12 is expressed in decibels.

In FIG. 8, the horizontal axis shows the normalized frequency, and the vertical axis shows the decibel value of the reflection coefficient S11.

Figure 9:
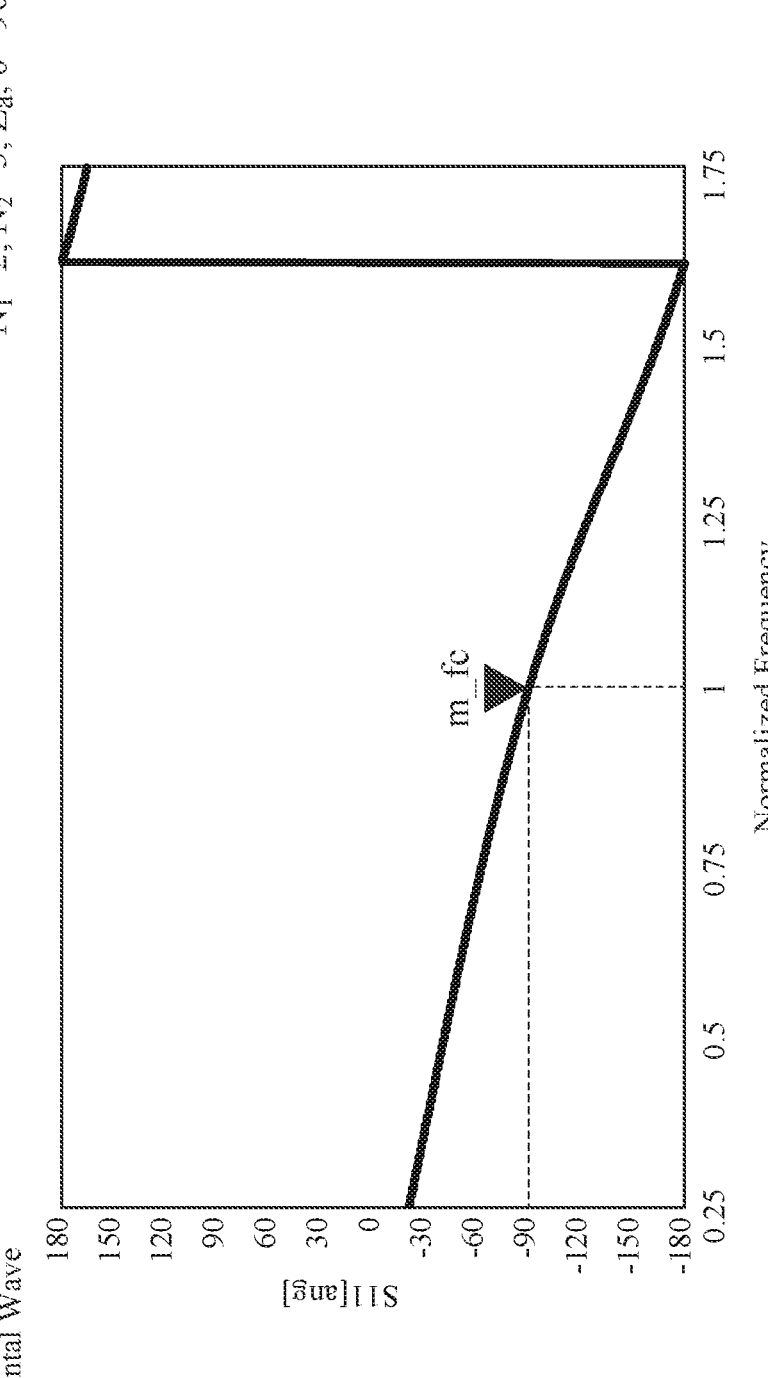
FIG. 9 is an explanatory drawing showing a result of the calculation of the transmission phase of the output matching circuit 12.

FIG. 9 is an explanatory drawing showing a result of the calculation of the transmission phase of the output matching circuit 12.

In FIG. 9, the horizontal axis shows the normalized frequency, and the vertical axis shows the transmission phase.

It is seen from FIGS. 7 and 8 that the impedance of the output matching circuit 12 matches with the characteristic impedance $Z_a$ at the center frequency $f_0$ of the fundamental wave.

Further, it is seen from FIG. 7 that an open end is formed at the frequency of the third harmonic. It is seen from FIG. 9 that the transmission phase of the output matching circuit 12 can be set to 90 degrees at the center frequency $f_0$ of the fundamental wave.

In above-mentioned Embodiment 1, the Doherty amplifier 100 is configured in such a way as to include: the carrier amplifier 4 to amplify the first high frequency signal having the first higher harmonic and the second higher harmonic; the peak amplifier 7 to amplify the second high frequency signal having the first higher harmonic and the second higher harmonic; the first series resonant circuit 9 connected between the output end 4*a* of the carrier amplifier 4 and the ground, to resonate at the frequency of the first higher harmonic; the second series resonant circuit 10 connected between the output end 7*a* of the peak amplifier 7 and the ground, to resonate at the frequency of the first higher harmonic; the first parallel resonant circuit 11 having an end connected to the output end 4*a* of the carrier amplifier 4, and another end connected to the output end 7*a* of the peak amplifier 7, to resonate at the frequency of the second higher harmonic; and the second parallel resonant circuit 13 having an end connected to the output end 7*a* of the peak amplifier 7 and the other end of the first parallel resonant circuit 11, and another end electrically connected to the load 17, to resonate at the frequency of the second higher harmonic. Therefore, the Doherty amplifier 100 can prevent a change in the impedance for each of the first and second higher harmonics, the change being caused by a change in the impedance of the load 17.

Embodiment 2

In Embodiment 2, a Doherty amplifier 100 in which a first higher harmonic is a third harmonic of a fundamental wave contained in a high frequency signal and a second higher harmonic is a second harmonic of the fundamental wave contained in the high frequency signal will be explained.

The configuration of the Doherty amplifier 100 according to Embodiment 2 is the same as that of the Doherty amplifier 100 according to Embodiment 1, and a schematic diagram showing the Doherty amplifier 100 according to Embodiment 2 is FIG. 1.

In the Doherty amplifier 100 according to Embodiment 2, $N_1$=3 in the equations (1) to (4). Further, $N_2$=2 in the equations (5) to (8).

In the Doherty amplifier 100 according to Embodiment 2, each of first and second series resonant circuits 9 and 10 resonates at the frequency of the third harmonic, and, as a result, a short-circuited end is formed, for the third harmonic, on each of output sides of carrier and peak amplifiers 4 and 7. More specifically, the impedance, for the third harmonic, seen from each of output ends 4a and 7a of the carrier and peak amplifiers 4 and 7 toward a load 17 is substantially zero.

Each of first and second parallel resonant circuits 11 and 13 resonates at the frequency of the second harmonic, and, as a result, an open end is formed, for the second harmonic, on each of the output sides of the carrier and peak amplifiers 4 and 7. More specifically, the impedance, for the second harmonic, seen from each of the output ends 4a and 7a of the carrier and peak amplifiers 4 and 7 toward the load 17 is infinite.

Because a short-circuited end is formed for the third harmonic, and, as a result, the impedance, for the third harmonic, of each of current sources 21 and 22 of the carrier and peak amplifiers 4 and 7 is substantially zero, each of the carrier and peak amplifiers 4 and 7 performs an inverse class F mode operation. Therefore, each of the carrier and peak amplifiers 4 and 7 operates with a high degree of efficiency.

Because the impedance, for the third harmonic, seen toward the load 17 is fixed to substantially zero, the impedance, for the third harmonic, seen toward the load 17 does not change even when the impedance for the third harmonic, out of the impedance $Z_0$ of the load 17, changes. Further, because the impedance, for the second harmonic, seen toward the load 17 is fixed to infinity, the impedance, for the second harmonic, seen toward the load 17 does not change even when the impedance for the second harmonic, out of the impedance $Z_0$ of the load 17, changes.

Therefore, even when either the impedance for the second harmonic at the load 17 or the impedance for the third harmonic at the load 17 changes, degradation in the operation efficiency of the Doherty amplifier 100 is prevented.

In the Doherty amplifier 100 according to Embodiment 1, the example in which the first higher harmonic is the second harmonic and the second higher harmonic is the third harmonic is shown. Further, in the Doherty amplifier 100 according to Embodiment 2, the example in which the first higher harmonic is the third harmonic and the second higher harmonic is the second harmonic is shown.

However, these are only examples, and the first higher harmonic and the second higher harmonic may be a third harmonic and a fourth harmonic, or the first higher harmonic and the second higher harmonic may be a fourth harmonic and a third harmonic, for example.

As an alternative, the first higher harmonic and the second higher harmonic may be a fourth harmonic and a fifth harmonic, or the first higher harmonic and the second higher harmonic may be a fifth harmonic and a fourth harmonic.

In the Doherty amplifiers 100 according to Embodiments 1 and 2, the phase correction circuit 5 is implemented by a 90-degree line. However, this is only an example, and the phase correction circuit 5 may be implemented by a surface mount component.

Each of the Doherty amplifiers 100 according to Embodiments 1 and 2 may be implemented by a monolithic microwave integrated circuit (MIMIC). In the case where the Doherty amplifier 100 is implemented by an MMIC, the inductors 9a, 10a, 11a, 13a, and 15 are implemented by spiral inductors. Further, the capacitors 9b, 10b, 11b, 13b, and 14 are implemented by metal insulator metal (MIM) capacitors. In the case where the Doherty amplifier 100 is implemented by an MIMIC, the Doherty amplifier 100 can be downsized to smaller than the Doherty amplifier 100 implemented by surface mount components.

In the Doherty amplifier 100 according to Embodiments 1 and 2, some of the inductors 9a, 10a, 11a, 13a, and 15 or some of the capacitors 9b, 10b, 11b, 13b, and 14 may be implemented by a microwave monolithic circuit (MIC) or surface mount components.

As an alternative, some inductance components in the inductors 9a, 10a, 11a, 13a, and 15 may be implemented by wires, a wiring pattern on a board, or an inner layer pattern of a multilayer board. In the case where some inductance components are implemented by wires or the like, because low-loss inductance components can be implemented as compared with the case where some inductance components are implemented by spiral inductors inside an MMIC, higher efficiency can be achieved.

It is to be understood that an arbitrary combination of the above-mentioned embodiments can be made, various changes can be made in an arbitrary component according to any one of the above-mentioned embodiments, or an arbitrary component according to any one of the above-mentioned embodiments can be omitted within the scope of the present disclosure.

INDUSTRIAL APPLICABILITY

The present disclosure is suitable for Doherty amplifiers.

REFERENCE SIGNS LIST

1: Input terminal, 2: Signal splitter, 3: Input matching circuit, 4: Carrier amplifier, 4a: Output end, 5: Phase correction circuit, 6: Input matching circuit, 7: Peak amplifier, 7a: Output end, 8: Load modulation circuit, 8a: Output end, 9: First series resonant circuit, 9a: Inductor, 9b: Capacitor, 10: Second series resonant circuit, 10a: Inductor, 10b: Capacitor, 11: First parallel resonant circuit, 11a: Inductor, 11b: Capacitor, 12: Output matching circuit, 13: Second parallel resonant circuit, 13a: Inductor, 13b: Capacitor, 14: Capacitor, 15: Inductor, 16: Output terminal, 17: Load, 21 and 22: Current source, 100: Doherty amplifier

The invention claimed is:
1. A Doherty amplifier comprising:
a carrier amplifier to amplify a first high frequency signal having a first higher harmonic and a second higher harmonic;
a peak amplifier to amplify a second high frequency signal having the first higher harmonic and the second higher harmonic;

a first series resonant circuit connected between an output end of the carrier amplifier and a ground, and configured to resonate at a frequency of the first higher harmonic;

a second series resonant circuit connected between an output end of the peak amplifier and the ground, and configured to resonate at the frequency of the first higher harmonic;

a first parallel resonant circuit having an end connected to the output end of the carrier amplifier, and another end connected to the output end of the peak amplifier, the first parallel resonant circuit being configured to resonate at a frequency of the second higher harmonic; and a second parallel resonant circuit having an end connected to the output end of the peak amplifier and the other end of the first parallel resonant circuit, and another end electrically connected to a load, the second parallel resonant circuit being configured to resonate at the frequency of the second higher harmonic.

2. The Doherty amplifier according to claim 1, wherein the Doherty amplifier comprises an output matching circuit having an end connected to the output end of the peak amplifier and the other end of the first parallel resonant circuit, and another end connected to the load, and including the second parallel resonant circuit, and the output matching circuit comprises, in addition to the second parallel resonant circuit, a capacitor connected between the other end of the second parallel resonant circuit and the ground, and an inductor having an end connected to the other end of the second parallel resonant circuit, and another end connected to the load.

3. The Doherty amplifier according to claim 1, wherein the first higher harmonic is a second harmonic of a fundamental wave contained in each of the first and second high frequency signals, and the second higher harmonic is a third harmonic of the fundamental wave, and wherein the first series resonant circuit and the second series resonant circuit form, for the second harmonic, a short-circuited end on an output side of each of the carrier and peak amplifiers, and the first parallel resonant circuit and the second parallel resonant circuit form, for the third harmonic, an open end on the output side of each of the carrier and peak amplifiers.

harmonic is a third harmonic of the fundamental wave, and wherein the first series resonant circuit and the second series resonant circuit form, for the second harmonic, a short-circuited end on an output side of each of the carrier and peak amplifiers, and the first parallel resonant circuit and the second parallel resonant circuit form, for the third harmonic, an open end on the output side of each of the carrier and peak amplifiers.

4. The Doherty amplifier according to claim 1, wherein the first higher harmonic is a third harmonic of a fundamental wave contained in each of the first and second high frequency signals, and the second higher harmonic is a second harmonic of the fundamental wave, and wherein the first series resonant circuit and the second series resonant circuit form, for the third harmonic, a short-circuited end on an output side of each of the carrier and peak amplifiers, and the first parallel resonant circuit and the second parallel resonant circuit form, for the second harmonic, an open end on the output side of each of the carrier and peak amplifiers.

5. The Doherty amplifier according to claim 1, wherein the first series resonant circuit is a series circuit in which an inductor and a capacitor are connected in series, and inductance of the inductor and capacitance of the capacitor are determined on a basis of parasitic capacitance of the carrier amplifier.

6. The Doherty amplifier according to claim 1, wherein the second series resonant circuit is a series circuit in which an inductor and a capacitor are connected in series, and inductance of the inductor and capacitance of the capacitor are determined on a basis of parasitic capacitance of the peak amplifier.

* * * * *